Figure 1:
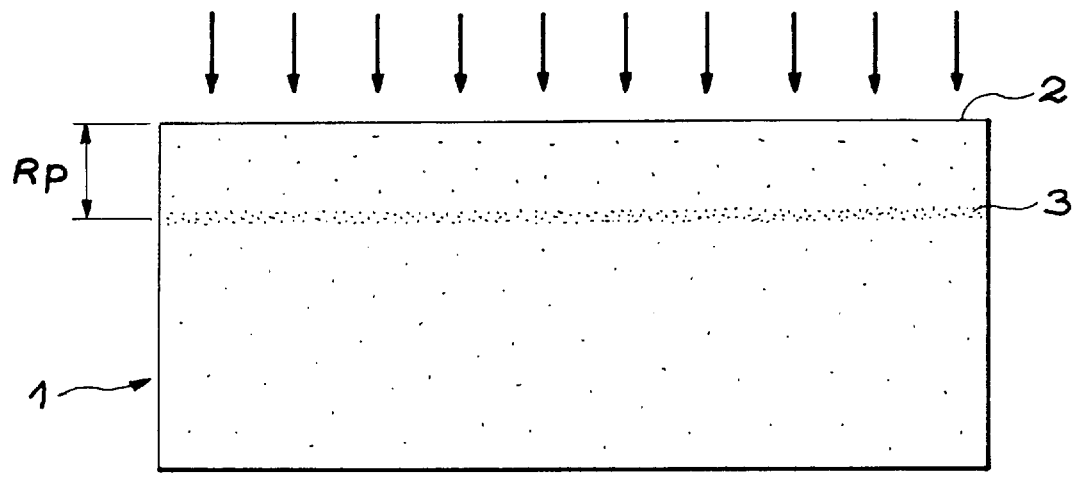

United States Patent [19]

Aspar et al.

[11] Patent Number: 6,020,252
[45] Date of Patent: *Feb. 1, 2000

[54] METHOD OF PRODUCING A THIN LAYER OF SEMICONDUCTOR MATERIAL

[75] Inventors: Bernard Aspar, Rives; Michel Bruel, Veurey; Thierry Poumeyrol, Vaulnaveys-le-haut, all of France

[73] Assignee: Commissariat a l'Energie Atomique, France

[*] Notice: This patent issued on a continued prosecution application filed under 37 CFR 1.53(d), and is subject to the twenty year patent term provisions of 35 U.S.C. 154(a)(2).

[21] Appl. No.: 08/856,275

[22] Filed: May 14, 1997

[30] Foreign Application Priority Data

May 15, 1996 [FR] France .................................. 96 06086

[51] Int. Cl.⁷ .............................. H01L 21/30; H01L 21/46
[52] U.S. Cl. ........................... 438/458; 438/455; 438/459
[58] Field of Search .................................... 438/458, 459, 438/455

[56] References Cited

U.S. PATENT DOCUMENTS

| | | | |
|---|---|---|---|
| 5,374,564 | 12/1994 | Bruel | 437/24 |
| 5,413,951 | 5/1995 | Ohori et al. | 438/458 |
| 5,524,339 | 6/1996 | Gorowitz et al. | 438/118 |
| 5,559,043 | 9/1996 | Bruel | 437/24 |
| 5,567,654 | 10/1996 | Beilstein, Jr. et al. | |
| 5,618,739 | 4/1997 | Takahashi et al. | 438/459 |
| 5,622,896 | 4/1997 | Knotter et al. | 438/123 |

FOREIGN PATENT DOCUMENTS

| | | | |
|---|---|---|---|
| 533551A1 | 9/1992 | European Pat. Off. | H01L 21/265 |
| 665588A1 | 1/1995 | European Pat. Off. | H01L 21/20 |
| 703609A1 | 3/1996 | European Pat. Off. | H01L 21/762 |
| 2681472 | 9/1991 | France | H01L 21/265 |

OTHER PUBLICATIONS

"Silicon on insulator Material Technology" Bruel Electronics Letters; 31 (1995) Jul. 6; No. 14; pp. 1201–1202.

"Investigtion of the bubble formation mechnanism in a–Si:H films by Fourier–transform infrared microspectroscopy" Mishima et al Japan Applied Physics; 64(8); Oct. 15, 1988; pp. 3972–3974.

*Primary Examiner*—Kevin M. Picardat
*Assistant Examiner*—Deven Collins
*Attorney, Agent, or Firm*—Hayes, Soloway, Hennessey, Grossman & Hage, P.C.

[57] ABSTRACT

A thin layer of semiconductor material is produced by implanting ions through a flat face of a semiconductor wafer in order to create a layer of microcavities, the ion dose being within a specific range in order to avoid the formation of blisters on the flat face. The resulting wafer is then subjected to a thermal treatment step in order to achieve coalescence of the microcavities. During or following the thermal treatment, a thin layer is separated from the rest of the wafer by application of mechanical force.

15 Claims, 2 Drawing Sheets

METHOD OF PRODUCING A THIN LAYER OF SEMICONDUCTOR MATERIAL

This invention relates to a method of producing a thin layer of semiconductor material. The thin layer produced can possibly be provided with electronic components.

The invention permits the production of thin layers of either monocrystalline or polycrystalline or even amorphous semiconductor and, for example the production of substrates of the Silicon on Insulator type or the production of self-supporting thin layers of monocrystalline semiconductor. Electronic circuits and/or microstructures can be either completely or in part created in these layers or in these substrates.

It is known that implanting ions of a rare gas or of hydrogen in a semiconductor material induces the formation of microcavities at a depth proximate to the mean penetration depth of the ions. FR-A-2 681 472 discloses a method which uses this property in order to obtain a thin film of semiconductor. This method consists of subjecting a wafer of the desired semiconductor material that includes a flat face, to the following steps:

a first implantation step by bombarding the flat face of the wafer with ions creating, within the volume of the wafer and at a depth proximate to the penetration depth of the ions, a layer of microcavities separating the wafer into a lower region constituting the mass of the substrate and an upper region constituting the thin film, the ions being chosen from among the ions of rare gases or of hydrogen gas and the temperature of the wafer being maintained below the temperature at which the implanted ions can escape from the semiconductor by diffusion;

a second step of bringing the flat face of the wafer into close contact with a support made up of at least one layer of rigid material. This close contact may be created, for example using an adhesive substance, or by the effect of a preliminary preparation of the surfaces and possibly a thermal and/or electrostatic treatment in order to promote interatomic bonding between the support and the wafer;

a third step of thermal treatment of the wafer-support assembly at a temperature greater than the temperature at which the implantation was carried out and sufficient to create, through a crystal rearrangement effect in the wafer and through the pressure of the microcavities, a separation between the thin film and the mass of the substrate. This temperature is, for example, 500° C. for silicon.

This implantation is capable of creating a layer of gaseous microbubbles. This layer of microbubbles thus created within the volume of the wafer, at a depth proximate to the mean penetration depth of the ions demarcates, within the volume of the wafer, two regions separated by this layer: one region intended to constitute the thin film and one region forming the rest of the substrate.

According to the implantation conditions, after implantation of a gas, such as, for example hydrogen, cavities or microbubbles may or may not be observable by transmission electronic microscopy. In the case of silicon, there can be obtained microcavities, the size of which can vary from a few nm to several hundreds of nm. Hence, particularly when the implantation temperature is low, these cavities are only observable during the thermal treatment stage, a step during which nucleation is brought about in order to end up with the coalescence of the microcavities at the end of the thermal treatment.

The method described in FR-A-2 681 472 does not allow the production of electronic circuits in or at the surface of the flat face of the wafer after the ion implantation step. Indeed, the creation of such circuits implies the carrying out of certain classic micro-electronics operations (diffusion annealing, deposition etc.) that require thermal treatment stages (typically from 400° C. to 700° C.) according to the steps for silicon. At these temperatures, blisters form on the surface of the flat face of the implanted wafer. By way of example, for an implantation of hydrogen ions at a dose of $5.10^{16}$ protons/cm$^2$ and at 100 keV energy in a silicon wafer, a thermal treatment carried out at 500° C. for 30 min. leads to degradation of 50% of the surface of the flat face of the wafer, this degradation resulting in the appearance of blisters and to their bursting. It is then no longer possible to properly ensure that the flat face of the wafer is brought into close contact with the support (which will be called the applicator in the subsequent description) so as to detach the semiconductor layer from the rest of the wafer.

This phenomenon of the formation of blisters and craters in the surface of a silicon wafer implanted with hydrogen ions after annealing has been discussed in the article "Investigation of the bubble formation mechanism in a—Si:H films by Fourier-transform infrared microspectroscopy" by Y. Mishima and T. Yagishita, that appeared in the J. Appl. Phys. 64 (8), Oct. 15 1988, pages 3972–3974.

This invention has been conceived in order to improve the method described in FR-A-2 681 472. After a step of ion implantation within a range of appropriate doses and before the separation step, it allows to carry out a thermal treatment of the part of the wafer corresponding to the future thin layer, in particular between 400° C. and 700° C. for silicon, without degrading the surface condition of the flat face of the wafer and without separation of the thin layer. This intermediate thermal treatment can form part of the operations for developing electronic components or can be applied for other reasons.

The invention is also applicable in the case where the thickness of the thin layer is sufficient to confer good mechanical characteristics on it, in which case it is not necessary to use an applicator in order to achieve the separation of the thin layer from the rest of the wafer, but where it is desired, despite everything, to avoid surface defects in the flat face.

Therefore an objective of the invention is a method of production of a thin layer of semiconductor material from a wafer of said material having a flat face, including an ion implantation step consisting of bombarding said flat face with ions chosen from among the ions of rare gases or of hydrogen, at a specific temperature and a specific dose in order to create, in a plane called a reference plane and situated at a depth proximate to the mean depth of penetration of the ions, microcavities, the method also including a subsequent thermal treatment step at a temperature sufficient to achieve separation of the wafer into two parts, across the reference plane, the part situated on the side of the flat face constituting the thin layer, characterised in that:

the ion implantation step is carried out with an ion dose between a minimum dose and a maximum dose, the minimum dose being that from which there will be sufficient creation of microcavities to obtain the embrittlement of the wafer along the reference plane, the maximum dose, or critical dose being that above which, during the thermal treatment step, there is separation of the wafer, a separation step of separating the wafer into two parts, across the reference plane, is provided after or during the thermal treatment step, this separation step comprising the application of mechanical forces between the two parts of the wafer.

These mechanical forces can be tensile forces, shear forces or bending forces applied alone or in combination.

In the application, by microcavities, one understands cavities that can be of any form; for example, the cavities can be of a flat shape, that is to say of small height (a few interatomic distances) or of substantially spherical shape or any other different shape. These cavities can contain a free gaseous phase and/or atoms of gas arising from the implanted ions fixed to atoms of the material forming the walls of the cavities. In plain English, these cavities are generally called "platelets", "microblisters" or even "bubbles".

The thermal treatment carried out with the purpose of achieving separation of the thin layer from the rest of the wafer, allows the microcavities to be brought to a stable state. Indeed, under the effect of temperature, the microcavities coalesce to reach a final definitive condition. Hence, the temperature is chosen in such a way that this condition is obtained.

According to FR-A-2 681 472, the doses implanted are such that, under the effect of the thermal treatment, a layer of microcavities is obtained that allows the separation to be achieved directly.

According to this invention, the doses implanted are insufficient to achieve a separation during the thermal treatment, the doses implanted only allow an embrittlement of the wafer at the reference plane, the separation requires an extra step of applying mechanical forces. Furthermore, the critical dose, as defined in the invention, is less than the dose at which during the ion implantation and thermal treatment steps, there is blister formation on the flat face of the wafer. The problem of blisters does not therefore arise in the invention.

The method according to the invention can include, between the thermal treatment step and the separation step, a step consisting of producing all or part of at least one electronic component in the part of the wafer before forming the thin layer.

If the production of this electronic component requires phases of heat treatment, these are preferably carried out at a temperature below that of the thermal treatment.

If needed, just before the separation step, an extra step is provided, consisting of bringing said wafer, on the side of said flat face, into close contact with and rigidly fixing it to a support through which mechanical forces such as tensile and/or shearing forces will be applied.

This support can be a flexible support, for example a sheet of Kapton®. It can also be a rigid support such as a wafer of oxidised silicon.

Figure 2:
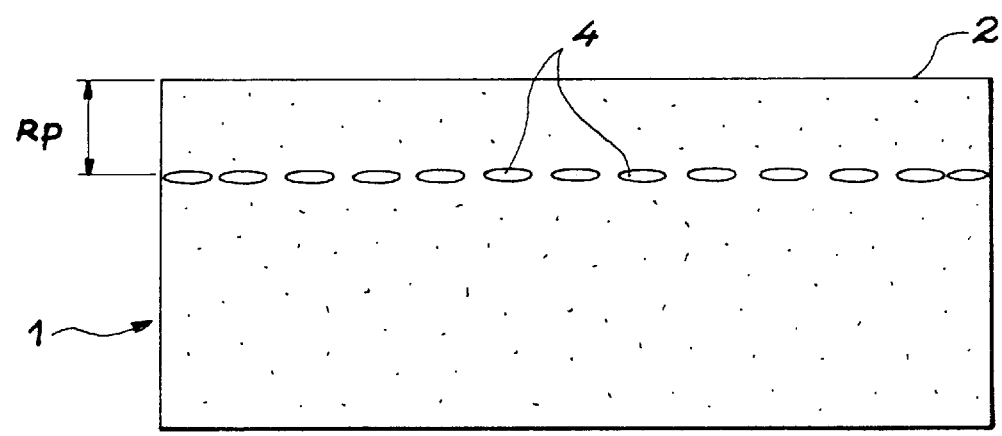
Figure 3:
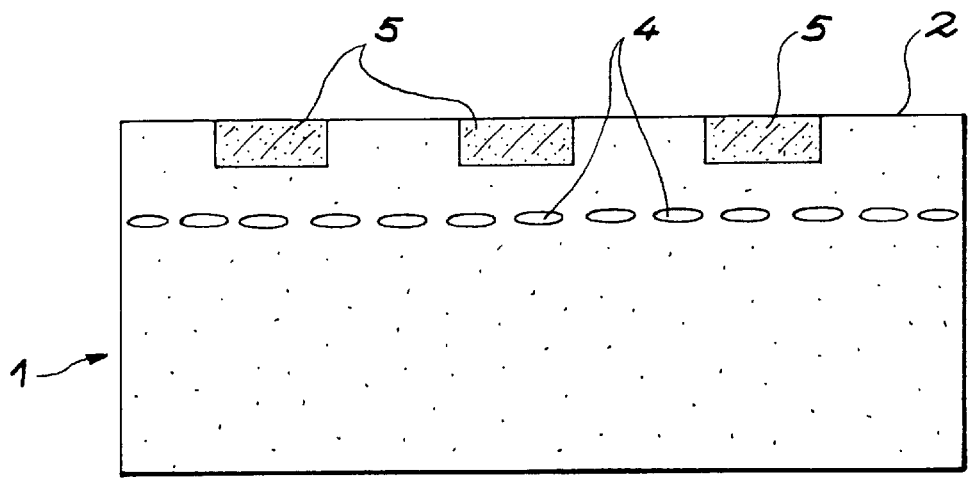
Figure 4:
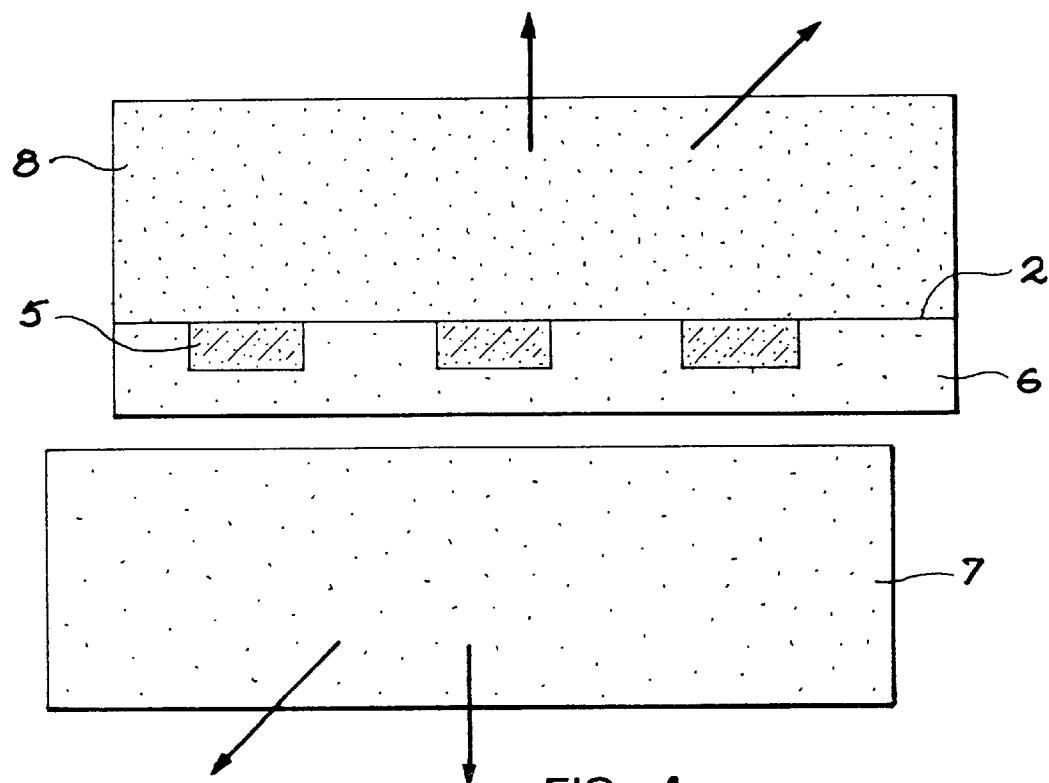

The invention will be better understood and other advantages and features will become apparent on reading the description that follows, giving by way of a non-limitative example, in which:

FIG. 1 represents diagrammatically a wafer of semiconductor material, one face of which is being subjected to ion bombardment in application of the method according to this invention, FIG. 2 represents diagrammatically the preceding wafer, at the end of the thermal treatment step intended to cause the microcavities to coalesce, according to this invention, FIG. 3 represents diagrammatically the preceding wafer, after formation of electronic components in the part corresponding to the desired thin layer, FIG. 4 represents diagrammatically the step of separating the preceding wafer into two parts, in accordance with this invention.

An important feature of this invention lies in the implantation of hydrogen or rare gas ions at a dose less than or equal to the dose above which there would be separation during the thermal treatment. The dose used is such that it permits embrittlement of the material at a depth $R_p$ corresponding to the mean distance travelled by the ions in the material, but the wafer remains sufficiently mechanically resistant to support all the thermal treatment steps necessary to produce the electronic circuits. In other terms, the implanted wafer has, in the area of the microcavities, solid bridges linking the part of the wafer designed to form the thin layer and the remaining part of the wafer.

The description is now going to be directed to the production of a thin layer of semiconductor material from a thick substrate having a flat face. The starting substrate may or may not be covered on this flat face with one or several layers of materials, such as, for example, encapsulating materials such as a dielectric.

FIG. 1 illustrates the ion implantation step of a wafer 1 of semiconductor material. The flat face 2 of the wafer receives the ionic bombardment represented by arrows. In the case where the flat face 2 of the wafer is covered with one or several non-semiconductor materials, the energy of the ions is chosen to be sufficient for them to penetrate into the mass of semiconductor material.

If the case arises, the thickness of the implanted semiconductor material must be such that all or part of electronic components and/or microstructures can be produced in the thin layer. By way of example, the mean penetration of hydrogen ions is 2 μm at 200 keV in silicon.

The ion implantation of these types of ions into the semiconductor substrate creates, at a depth proximate to the depth corresponding to the mean distance $R_p$ travelled by the ions along a perpendicular to the flat face, an area 3 with a high concentration of atoms giving rise to microcavities. For example, the maximum concentration of hydrogen is $10^{21}$ $H^+/cm^3$ for an implantation dose of $2.10^{16}$ $H^+/cm^2$ at 100 keV. This ion implantation step must be carried out at a temperature such that the implanted gas ions do not diffuse any great distance as the implantation step goes along. This would interfere with or ruin the formation of microcavities. For example, in the case of an implantation of hydrogen ions in silicon, the implantation will be carried out at a temperature below 350° C.

The implantation dose (number of ions received per unit surface area during the implantation period) is chosen in such a way that the dose is less than or equal to a dose, called the critical dose, such that, above this critical dose, during the subsequent thermal treatment step, there is separation of the thin layer from the rest of the wafer. In the case of implantation of hydrogen ions, this critical dose is of the order of $4.10^{16}$ $H^+/cm^2$ for an energy of 160 keV.

The implantation dose is also chosen to be greater than a minimum dose from which during the subsequent thermal treatment step, the formation of microcavities and the interaction between them is sufficient, that is to say it permits the embrittlement of the implanted material in the area of the microcavities 3. This means that solid bridges of semiconductor material still exist between the microcavities. In the case of an implantation of ions of hydrogen gas into a silicon substrate, this minimum dose is of the order of $1.10^{16}/cm^2$ at an energy of 100 keV.

The following step of the method according to the invention consists of a thermal treatment of the wafer at a temperature that is sufficient to allow coalescence of the microcavities along the reference plane. In the case of an implantation, at a temperature below 350° C., of ions of hydrogen gas into a silicon substrate and a dose of $3.10^{16}$ $H^+/cm^2$ at an energy of 100 keV, after a thermal treatment of thirty minutes at 550° C., it is observed by transmission electronic microscopy in section, cavities of height equal to a few fractions of nanometers and with an extension, along the reference plane of several nanometers or indeed several tens of nanometers. This thermal treatment permits, at the same time, the precipitation and then stabilization of the atoms of implanted gas in the form of microcavities.

The microcavities 4 (see FIG. 2) occupy, along the reference plane, a surface area approximately equal to the surface area implanted. The cavities are not situated exactly in the same plane. They are in planes parallel to the reference plane, some nanometers or tens of nanometers from the reference plane. For this reason, the upper part of the substrate situated between the reference plane and the flat face 2 is not totally separated from the body of the substrate, the body of the substrate being defined as the rest of the substrate between the reference plane and the faces of the substrate other than the flat face. The remaining bonds are sufficiently strong to support the steps of manipulation and of annealing brought about by the technological steps taken in the creation of the integrated circuits. However, the bond between the upper part and the mass of the substrate is very much weakened since this bond is only made through bridges of semiconductor material situated between the cavities.

All or a part of electronic components, circuits and microstructures can then be created on the flat face 2 (at the surface or under the surface).

The ion implantation energy of the hydrogen or rare gas ions in the first step has been chosen in such a way that the depth of the area of microcavities is sufficient for it not to be disturbed by the creation of components, electronic circuits and/or microstructures during this step. Furthermore, the whole of the thermal annealing operations that the development of electronic circuits or microstructures requires, is chosen in such a way that possible diffusion of the implanted ions is minimized. For example, in the case of a wafer of monocrystalline silicon, the maximum temperature of the various phases of the method will be limited to 900° C.

FIG. 3 illustrates the case where several electronic components, reference number 5, have been developed on the flat face 2 and in the part of the wafer intended to form the thin layer.

The separation step then follows. It consists of applying separating mechanical forces, for example, tensile forces between the parts of the wafer or substrate situated on each side of the reference plane in a manner that fractures the remaining solid bridges. This operation allows to obtain the thin layer of semiconductor material fitted with electronic components in the case described. FIG. 4 illustrates this separation step in the course of which the thin layer 6 is separated from the remaining mass 7 of the substrate by the action of forces acting in the opposite direction and represented by the arrows.

Experience shows that the tensile stress necessary to separate the upper part of the body of the substrate is low particularly when a shearing stress is applied between the upper part and the body of the substrate, that is to say when the stresses applied have a component applied along the reference plane. This is simply explained by the fact that the shear stress promotes the propagation of fractures and cavities within the reference plane.

The upper part of the substrate, being by nature thin, the tensile stress and/or the shear stress cannot in most cases easily be applied directly to it. It is then preferable, before the separation step, to make the wafer, via its flat face 2, integral with a support or applicator through which the mechanical forces will be applied to the upper part of the wafer. This applicator is represented in FIG. 4 under reference number 8.

The applicator can be a rigid or a flexible support. By the term rigidly fixing the applicator onto the wafer, one understands here any sticking operation or operation of preparing the surfaces and bringing them into contact that allows sufficient bonding energy to be provided between the applicator and the flat face of the wafer to resist the tensile and/or shear and/or bending process(es) of the separation step.

The applicator can be, for example, a sheet of plastic material such as Kapton® which has been made adherent to the flat face of the substrate. In this example, after application of the method according to the invention, a thin layer of monocrystalline semiconductor on a sheet of Kapton® is obtained.

So as to properly transmit the stresses to the whole of the upper thin layer, the circuits created in and at the surface of the upper layer can have been covered with a protective layer, possibly making it flat, during the step of developing the electronic components. The applicator is then rigidly fixed to the upper thin layer of the wafer through this protective layer.

The applicator may also be a rigid support, for example a silicon wafer, the surface of which has been covered with a dielectric layer. An appropriate physico-chemical treatment is, for example, carried out on the flat face of the wafer and/or the surface of the applicator (carrying a dielectric layer or not) so that bringing them into contact, possibly associated with a heat treatment, rigidly fixes the flat face of the wafer and the applicator together.

In the case mentioned as an example where the applicator is a silicon wafer carrying a layer of oxide on its surface and where the semiconductor substrate is a wafer of monocrystalline silicon, after application of the method according to the invention, a wafer of silicon on insulator is obtained where the surface layer of silicon is the fine layer provided by the upper part of the substrate.

Furthermore, after separation of the thin layer from the rest of the wafer, the free face of this layer can allow the further repeat use of a substrate that can be fitted with electronic components produced completely or partially on the substrate. Such a stacking allows a "three dimensional" assembly of electronic circuits, the stiffener itself possibly including electronic components.

We claim:

1. In a method of producing a thin layer of semiconductor material from a wafer of said material, wherein a semiconductor wafer having a flat face is subjected to ion implantation by bombarding said flat face with ions of a rare gas or hydrogen whereby to produce within the volume of said wafer and at a depth approximate to the penetration of the ions, a layer of microcavities separating the wafer into a lower region constituting the mass of the substrate and an upper region constituting the thin film, and the wafer is subjected to a thermal treatment, and the thin film upper region separated from the lower region substrate mass, the improvement wherein the ion implantation step is carried out with an ion dosage level sufficient to create microcavities to embrittle said wafer along a line of implantation, but below the dosage level sufficient to cause the wafer to separate during said thermal treatment, and, during or following said thermal treatment applying a mechanical force sufficient to separate said wafer along the line of implantation into a thin top layer and a lower layer comprising the remainder of the mass of the substrate.

2. A method according to claim 1, and further comprising, between said thermal treatment step and separation step, an intermediate step of treating said wafer so as to produce, at least in part, at least one electronic component in the top layer portion thereof.

3. A method according to claim 2, wherein said intermediate step of treating requiring thermal treatment phases, there are carried out at a temperature below the temperature of said thermal treatment step.

4. A method according to claim 1, and further comprising a step of fixing the flat face side of the wafer to a substrate prior to separating the wafer along the implantation level.

5. A method according to claim 4, wherein said wafer is affixed to a flexible support.

6. A method according to claim 5, wherein said flexible support comprises a sheet of Kapton®.

7. A method according to claim 4, wherein said semiconductor substrate is affixed to a rigid support.

8. A method according to claim 4, wherein said rigid support comprises a wafer of oxidized silicon.

9. A method according to claim 1, wherein said wafer of semiconductor material comprises monocrystalline silicon.

10. A method according to claim 1, and including the step of covering said wafer of semiconductor material on the flat face side with a layer of non-semiconductor material.

11. A method according to claim 10, wherein said non-semiconductor material comprises a dielectric material.

12. A method according to claim 1, wherein said mechanical force comprises a tensile force.

13. A method according to claim 1, wherein said mechanical force comprises a sheer force.

14. A method according to claim 1, wherein said mechanical force comprises a bending force.

15. A method according to claim 1, wherein said mechanical force comprises one or more mechanical forces selected from the group consisting of a tensile force, a sheer force, a bending force and a mixture of two or more of said forces.

* * * * *